US010008932B2

(12) United States Patent
Umemoto

(10) Patent No.: US 10,008,932 B2
(45) Date of Patent: Jun. 26, 2018

(54) SYNCHRONOUS RECTIFICATION DC/DC CONVERTER

(71) Applicant: ROHM CO., LTD., Kyoto (JP)

(72) Inventor: Kiyotaka Umemoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days. days.

(21) Appl. No.: 15/357,324

(22) Filed: Nov. 21, 2016

(65) Prior Publication Data

US 2017/0155323 A1    Jun. 1, 2017

(30) Foreign Application Priority Data

Nov. 26, 2015  (JP) .................................. 2015-230734

(51) Int. Cl.

| H02M 3/158 | (2006.01) |
|---|---|
| H02M 1/08 | (2006.01) |
| H03K 17/042 | (2006.01) |
| H03K 17/16 | (2006.01) |
| H02M 1/00 | (2006.01) |

(52) U.S. Cl.
CPC .............. H02M 3/158 (2013.01); H02M 1/08 (2013.01); H02M 3/1588 (2013.01); H03K 17/04206 (2013.01); H03K 17/165 (2013.01); H02M 2001/0032 (2013.01); Y02B 70/1466 (2013.01); Y02B 70/16 (2013.01)

(58) Field of Classification Search
CPC ......... H02M 2001/0025; H02M 3/156; H02M 3/158; H02M 3/1588
See application file for complete search history.

(56) References Cited

U.S. PATENT DOCUMENTS

| 7,265,601 B2 * | 9/2007 | Ahmad | H02M 1/08 323/313 |
|---|---|---|---|
| 7,514,908 B2 * | 4/2009 | Hosokawa | H02M 3/1588 323/222 |
| 7,741,901 B2 * | 6/2010 | Lu | H03K 17/162 323/224 |
| 8,536,808 B2 * | 9/2013 | Sarig | H02M 1/36 315/360 |
| 2010/0259238 A1 * | 10/2010 | Cheng | H02M 1/36 323/282 |

FOREIGN PATENT DOCUMENTS

| JP | 2001-095234 | 4/2001 |
|---|---|---|
| JP | 2014-023272 | 2/2014 |

* cited by examiner

*Primary Examiner* — Gary L Laxton
(74) *Attorney, Agent, or Firm* — Fish & Richardson P.C.

(57) ABSTRACT

A synchronous rectification DC/DC converter includes a first transistor and a second transistor including respective main electrodes connected to a common connection point, the first transistor and the second transistor being NMOS transistors, a control circuit configured to control switching of the first transistor and the second transistor in a complementary manner, a bootstrap circuit that includes a first capacitor charged with a current supplied from a high voltage potential terminal and is configured to raise a voltage potential of a control electrode of the first transistor to turn on the first transistor, and a charging stop circuit configured to stop the first capacitor from being charged from the high voltage potential terminal in a time period in which the first transistor and the second transistor are turned off simultaneously.

8 Claims, 8 Drawing Sheets

US 10,008,932 B2

SYNCHRONOUS RECTIFICATION DC/DC CONVERTER

CROSS-REFERENCE TO RELATED APPLICATION

This application is based upon and claims the benefit of priority from Japanese Patent Application No. 2015-230734, filed on Nov. 26, 2015, the entire contents of which are incorporated herein by reference.

TECHNICAL FIELD

The present disclosure relates to a synchronous rectification DC/DC converter including a bootstrap circuit for use in a switching power supply.

BACKGROUND

A DC/DC converter is used for electronic equipment, OA (Office Automation) equipment, and the like. In a DC/DC converter including a high side MOS transistor and a low side MOS transistor, each of which is an N-channel metal oxide semiconductor field effect transistor (NMOSFET), in order to operate the high side MOS transistor appropriately, it is necessary to set a gate-source voltage of the high side MOS transistor to be higher than a drain-source voltage of the high side MOS transistor. To this end, a bootstrap circuit is used in the high side MOS transistor.

FIG. 7 is a schematic circuit diagram of a synchronous rectification step-down DC/DC converter including a conventional bootstrap circuit. Hereinafter, a conventional synchronous rectification step-down/DC converter is described below with reference to FIG. 7.

In FIG. 7, the DC/DC converter includes a control circuit DRV, a first gate driver DR1, a second gate driver DR2, a switching transistor Q1, a synchronous rectification transistor Q2, a series regulator SR, a bootstrap circuit BS, an inductor L, and a capacitor C. A smoothing circuit includes the inductor L and the capacitor C.

The control circuit DRV switches on/off states of the switching transistor Q1 and the synchronous rectification transistor Q2 complementarily by means of a PWM (Pulse Width Modulation) or PFM (Pulse Frequency Modulation) control.

The first gate driver DR1 and the second gate driver DR2 generate a drive signal S1 and a drive signal S2, respectively, in response to control signals from the control circuit DRV, and switch the on/off states of the switching transistor Q1 and the synchronous rectification transistor Q2 complementarily.

NMOS transistors may be used for the switching transistor Q1 and the synchronous rectification transistor Q2. In addition, a parasitic diode D1, which is typically called a body diode, exists between a source and a drain of the switching transistor Q1. Similarly, a parasitic diode D2, which is typically called a body diode, exists between a source and a drain of the synchronous rectification transistor Q2.

The bootstrap circuit BS includes a diode Db and a capacitor Cb. The bootstrap circuit BS is used to generate a voltage to be applied to a power terminal (high voltage potential terminal) of the first gate driver DR1. The voltage is supplied from a node between the diode Db and the capacitor Cb to the power terminal of the first gate driver DR1. Thus, it is possible to increase a voltage to be applied to a gate of the switching transistor Q1. As a result, it is possible to reliably turn on the switching transistor Q1. In addition, a transistor may be used instead of the diode Db.

The series regulator SR includes a third transistor Q3 and an error amplifier ERR. The series regulator SR is a step-down regulator and is used to lower an input voltage to a predetermined output voltage. A P-channel metal oxide semiconductor field effect transistor (PMOSFET) is used for the third transistor Q3.

Next, the circuit configuration and the circuit connection of the DC/DC converter including the bootstrap circuit of FIG. 7 are described below.

Although not shown, the control circuit DRV includes, for example, an error amplifier, a PWM comparator, a phase compensation circuit, various protection circuits, a dead time generation circuit, etc. A first output terminal Do1 of the control circuit DRV is connected to an input terminal of the first gate driver DR1. A second output terminal Do2 of the control circuit DRV is connected to an input terminal of the second gate driver DR2. An output terminal of the first gate driver DR1 is connected to the gate G of the switching transistor Q1. An output terminal of the second gate driver DR2 is connected to a gate G of the synchronous rectification transistor Q2. The drain D of the switching transistor Q1 is connected to a power terminal (high voltage potential terminal) Vin. The source S of the switching transistor Q1 is connected to a node N1. The drain D of the synchronous rectification transistor Q2 is connected to the node N1. The source S of the synchronous rectification transistor Q2 is connected to a ground terminal (low voltage potential terminal) GND. The inductor L is connected between the node N1 and a node N2. The capacitor C is connected between the node N2 and the ground terminal (low voltage potential terminal) GND. The smoothing circuit includes the inductor L and the capacitor C. The node N2 is connected to an output terminal OUT. A load RL is connected to the output terminal OUT. A CPU (Central Processing Unit), a GPU (Graphics Processing Unit), a memory, or the like is connected as the load RL.

A source S of the third transistor Q3 is connected to the power terminal (high voltage potential terminal) Vin. A drain D of the third transistor Q3 is connected to a node N3. The node N3 is an output terminal of the series regulator SR. A gate G of the third transistor Q3 is connected to an output terminal of the error amplifier ERR. A non-inverting input terminal (+) of the error amplifier ERR is connected to the node N3. A reference voltage Vref is applied to an inverting input terminal (−) of the error amplifier ERR. An output voltage Vreg outputted to the node N3 as the output terminal of the series regulator SR is approximately equal to the reference voltage Vref. As such, the output voltage Vreg is set by the reference voltage Vref.

An anode of the diode Db is connected to the node N3. The capacitor Cb is connected between a cathode of the diode Db and the node N1. The bootstrap circuit BS includes the diode Db and the capacitor Cb.

The power terminal (high voltage potential terminal) of the first gate driver DR1 is connected to the cathode of the diode Db. A low voltage potential terminal of the first gate driver DR1 is connected to the node N1. The output voltage Vreg of the series regulator SR is applied to a power terminal (high voltage potential terminal) of the second gate driver DR2. A ground terminal (low voltage potential terminal) of the second gate driver DR2 is grounded.

Next, the signal flow and the circuit operation of the DC/DC converter including the bootstrap circuit of FIG. 7 are described below.

The control circuit DRV inputs a control signal to each of the first gate driver DR1 and the second gate driver DR2, for example, in response to a signal from a PWM comparator (not shown) or the like.

The first gate driver DR1 amplifies the control signal from the control circuit DRV and generates the drive signal S1. The switching transistor Q1 is driven by the drive signal S1. The second gate driver DR2 amplifies the control signal from the control circuit DRV and generates the drive signal S2. The synchronous rectification transistor Q2 is driven by the drive signal S2. Thus, the switching transistor Q1 and the synchronous rectification transistor Q2 are turned on or off in a complementary manner, and a current IL flows into the inductor L. The current IL is smoothed by the capacitor C and an output voltage Vout is generated on the output terminal OUT. When the load RL is connected to the output terminal OUT, an output current Tout is outputted.

The error amplifier ERR in the series regulator SR compares the reference voltage Vref and a supply voltage yin of the power terminal (high voltage potential terminal) Vin, and controls an on/off state of the third transistor Q3. As a result, the predetermined voltage Vreg is supplied to the bootstrap circuit BS.

Due to the output voltage Vreg of the series regulator SR, a charging current Ib0 flows into the diode Db of the bootstrap circuit BS and the capacitor Cb is charged. Thus, a sum of the supply voltage yin and a voltage Vreg−Vd (which is the voltage that is lowered from the output voltage Vreg of the series regulator SR by a forward voltage Vd of the diode Db), i.e., a voltage vin+Vreg−Vd, is applied to the power terminal (high voltage potential terminal) of the first gate driver DR1. This voltage higher than the supply voltage yin ensures that the switching transistor Q1 is turned on. As described above, the bootstrap circuit BS sets a high level H of the drive signal S1 to the sum of the supply voltage yin and the voltage Vreg−Vd (which is the voltage that is lowered from the output voltage Vreg of the series regulator SR by the forward voltage Vd of the diode Db), i.e., the voltage vin+Vreg−Vd. A low level L of the drive signal S1 is 0V. As such, the high level H of the drive signal S1 is set to a voltage higher, for example, by 3V to 5V than the supply voltage yin of the power terminal (high voltage potential terminal) Vin.

FIG. 8 is a timing chart for the operation of the DC/DC converter of FIG. 7. Hereinafter, the operation of the DC/DC converter is described below with reference to FIGS. 7 and 8.

In a time period from time t0 to time t1, since the level of the drive signal S1 is 0V, the switching transistor Q1 is in the off state. Since the level of the drive signal S2 is Vreg, the synchronous rectification transistor Q2 is in the on state. In addition, the level of the node N3 is Vreg and the level of the node N1 is 0V. Accordingly, the capacitor Cb is charged as the charging current Ib0 flows into the capacitor Cb. Prior to time t0, for example, the energy is stored in the inductor L and a voltage due to a counter-electromotive force is generated across the inductor L. Therefore, in the time period from time t0 to time t1, the current IL flows from the ground terminal (low voltage potential terminal) GND into the inductor L through the synchronous rectification transistor Q2.

In a time period T12 from time t1 to time t2, since the level of the drive signal S1 is 0V, the switching transistor Q1 is in the off state. Since the level of the drive signal S2 is changed from Vreg to 0V, the synchronous rectification transistor Q2 is switched from the on state to the off state. Here, the parasitic diode D2 exists in the synchronous rectification transistor Q2. In addition, the energy is stored in the inductor L and a voltage due to a counter-electromotive force is generated across the inductor L. Thus, the current IL flows from the ground terminal (low voltage potential terminal) GND into the inductor L through the parasitic diode D2. Therefore, a voltage drop corresponding to a forward voltage Vf of the parasitic diode D2 occurs on the node N1 and the level of the node N1 is changed from 0V to −Vf. In addition, the level of the node N3 remains at Vreg. Although the level of the node N3 remains constant, since the level of the node N1 is lowered from 0V to −Vf, the charging current Ib0 flowing into the capacitor Cb is increased.

In a time period from time t2 to time t3, since the level of the drive signal S1 is changed from 0V to vin+Vreg−Vd by the bootstrap circuit BS, the switching transistor Q1 is switched from the off state to the on state. On the other hand, since the level of the drive signal S2 remains at 0 v, the synchronous rectification transistor Q2 remains in the off state. In addition, the level of the node N3 remains at Vreg. The level of the node N1 is changed from −Vf to Vsw which is substantially equal to the supply voltage vin. Therefore, the charging current Ib0 does not flow into the capacitor Cb. In addition, since the current IL flows from the power terminal (high voltage potential terminal) Vin into the inductor L through the switching transistor Q1, the energy is stored in the inductor L.

In a time period from T34 time t3 to time t4, since the level of the drive signal S1 is changed from vin+Vreg−Vd to 0V, the switching transistor Q1 is switched from the on state to the off state. Since the level of the drive signal S2 is 0V, the synchronous rectification transistor Q2 remains in the off state. In this case, the energy is stored in the inductor L and a voltage due to a counter-electromotive force is generated across the inductor L. Thus, the current IL flows from the ground terminal (low voltage potential terminal) GND into the inductor L through the parasitic diode D2. Accordingly, a voltage drop corresponding to the forward voltage Vf of the parasitic diode D2 occurs on the node N1 and the level of the node N1 is changed from Vsw to −Vf. In addition, the level of the node N3 remains at Vreg. Although the level of the node N3 remains constant, since the level of the node N1 is lowered from Vsw to −Vf, the charging current Ib0 flows into the capacitor Cb in a larger amount than the case where the level of the node N1 is lowered from Vsw to 0V.

After time t4, the same operation as in the time period from time t0 to time t4 is repeated. Therefore, every time the switching transistor Q1 and the synchronous rectification transistor Q2 are turned off at the same time, the charging current Ib0 flows into the capacitor Cb. This results in an increased power consumption of the DC/DC converter.

As described above, in the synchronous rectification DC/DC converter, in order to prevent a through-current which occurs when the high side switching transistor Q1 and the low side synchronous rectification transistor Q2 are turned on at the same time, a dead time for which both of the switching transistor Q1 and the synchronous rectification transistor Q2 are turned off at the same time is provided. In the dead time, due to the parasitic diode D2 formed in the synchronous rectification transistor Q2, the voltage potential between the switching transistor Q1 and the synchronous rectification transistor Q2 is lower than the voltage potential at the source side of the synchronous rectification transistor Q2 by −Vf. Accordingly, in the time period T12 and the time period T34, every time both of the high side switching transistor Q1 and the low side synchronous rectification transistor Q2 are turned off, the wasteful charging current Ib0 flows into the internal capacitor Cb of the bootstrap circuit BS. This results in an increased power consumption of the DC/DC converter.

Various solutions have been taken to solve the above problem.

As a solution, there has been proposed a switching power supply circuit in which a charging current flowing into a capacitor of a bootstrap circuit is stopped when a high side transistor is turned on, which may result in a reduction in power consumption by the amount of the charging current.

As another solution, there has been proposed a semiconductor integrated circuit in which when a charge pump is in at a standby state of not performing a stepping-up operation, a high side transistor and a low side transistor are in an off state and a current does not flow into a resistance voltage dividing circuit to detect a step-up voltage only with a capacitance voltage dividing circuit. With the above configuration, the power consumption is reduced in the standby state.

In the above-proposed switching power supply circuits, when the high side transistor is turned on, the charging current flowing into the capacitor of the bootstrap circuit is stopped. However, this technique does not disclose how to prevent the charging current from flowing into the capacitor of the bootstrap circuit in a dead time.

The above-proposed semiconductor integrated circuits do not disclose how to prevent a charging current from flowing into a capacitor of a bootstrap circuit in a dead time.

SUMMARY

The present disclosure provides some embodiments of a synchronous rectification DC/DC converter including a bootstrap circuit, which is capable of reducing power consumption of the bootstrap circuit which may occur when a dead time is provided.

According to one embodiment of the present disclosure, there is provided a synchronous rectification DC/DC converter including a first transistor and a second transistor, each of the first transistor and the second transistor including a main electrode connected to a common connection point, the first transistor and the second transistor being NMOS transistors; a control circuit configured to control switching of the first transistor and the second transistor in a complementary manner; a bootstrap circuit that includes a first capacitor charged with a current supplied from a high voltage potential terminal and is configured to raise a voltage potential of a control electrode of the first transistor to turn on the first transistor; and a charging stop circuit configured to stop the first capacitor from being charged from the high voltage potential terminal in a time period in which the first transistor and the second transistor are turned off simultaneously.

A first end of the first capacitor may be connected to the common connection point of the first transistor and the second transistor. The current may be supplied from the high voltage potential terminal to a second end of the first capacitor, and the voltage potential of the control electrode of the first transistor may be raised based on a voltage potential of the second end of the first capacitor. Further, the charging stop circuit cuts off supply of a current from the second end of the first capacitor to the first end of the first capacitor.

The charging stop circuit may include a switch connected between the high voltage potential terminal and the second end of the first capacitor.

The switch connected between the high voltage potential terminal and the second end of the first capacitor may include a transistor.

A first end of the first capacitor may be connected to the common connection point of the first transistor and the second transistor. The current may be supplied from the high voltage potential terminal to a second end of the first capacitor, and the voltage potential of the control electrode of the first transistor may be raised based on a voltage potential of the second end of the first capacitor. Further, the charging stop circuit cuts off supply of a current from the high voltage potential terminal to the second end of the first capacitor by lowering the voltage potential of the second end of the first capacitor.

The synchronous rectification DC/DC converter may further include a series regulator connected between the high voltage potential terminal and the bootstrap circuit and configured to apply a voltage potential, which is lower by a predetermined voltage than a voltage potential of the high voltage potential terminal, to the bootstrap circuit. The charging stop circuit may lower the voltage potential of the second end of the first capacitor by decreasing a reference voltage of the series regulator.

The charging stop circuit may include a switch which connects a negative electrode of a reference voltage source of the series regulator to the common connection point in the time period in which the first transistor and the second transistor are turned off simultaneously, and connects the negative electrode of the reference voltage source of the series regulator to a low voltage potential terminal in a time period in which the first transistor or the second transistor is turned on.

The switch which connects a negative electrode of a reference voltage source of the series regulator to the common connection point in the time period in which the first transistor and the second transistor are turned off simultaneously, and connects the negative electrode of the reference voltage source of the series regulator to a low voltage potential terminal in a time period in which the first transistor or the second transistor is turned on may include a transistor.

The series regulator may include a third transistor and an error amplifier. A first electrode of the third transistor may be connected to the high voltage potential terminal, and a second electrode of the third transistor may be connected to the bootstrap circuit and a non-inverting input terminal of the error amplifier. An output terminal of the error amplifier may be connected to a control electrode of the third transistor, and an inverting input terminal of the error amplifier may be connected to a positive electrode of the reference voltage source.

In the time period in which the first transistor and the second transistor are turned off simultaneously, the voltage potential of the second end of the first capacitor may be lower by a forward voltage of a parasitic diode formed in the second transistor than the voltage potential of the second end of the first capacitor in the time period in which the first transistor or the second transistor is turned on.

The first transistor may be a switching transistor and the second transistor is a synchronous rectification transistor. The DC/DC converter may further include a smoothing circuit connected to the common connection point of the switching transistor and the synchronous rectification transistor; and an output terminal outputting a voltage smoothed by the smoothing circuit.

The smoothing circuit may include an inductor connected between the output terminal and the common connection point of the switching transistor and the synchronous rectification transistor; and a second capacitor charged with a current flowing into the inductor.

The first transistor may be a synchronous rectification transistor and the second transistor is a switching transistor. The first transistor may be connected between the common connection point and an output terminal. The DC/DC converter may further include an inductor connected between the high voltage potential terminal and the common connection point of the switching transistor and the synchronous rectification transistor; and a second capacitor charged with a current flowing into the inductor.

The bootstrap circuit may further include a diode element which is connected between the high voltage potential terminal and the second end of the first capacitor and flows the current from the high voltage potential terminal toward the first capacitor.

The diode element may be a transistor.

DETAILED DESCRIPTION

First Embodiment

Figure 1:
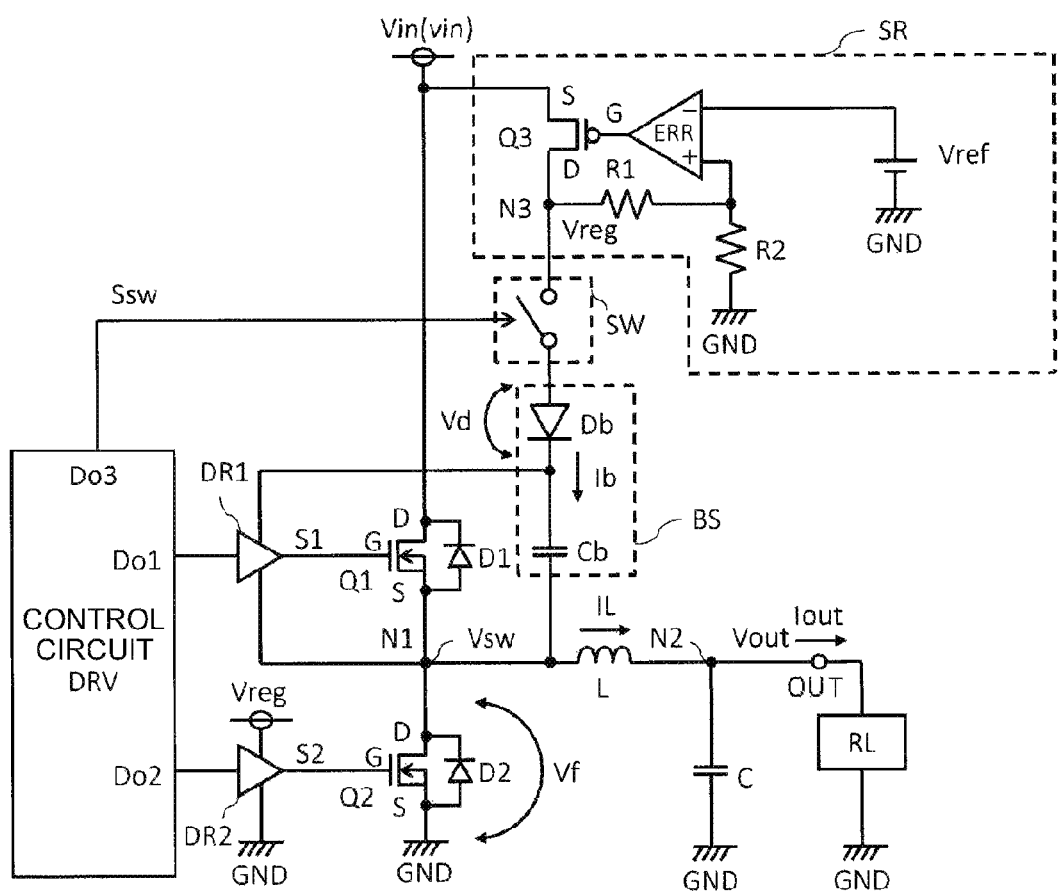
FIG. 1 is a circuit diagram of a synchronous rectification step-down DC/DC converter including a bootstrap circuit according to a first embodiment of the present disclosure.

FIG. 1 is a circuit diagram of a synchronous rectification step-down DC/DC converter including a bootstrap circuit according to a first embodiment of the present disclosure. The first embodiment of the present disclosure is described below with reference to the drawings. Those having the same functions are denoted by the same reference numerals, and explanations for them are not repeated.

Figure 7:
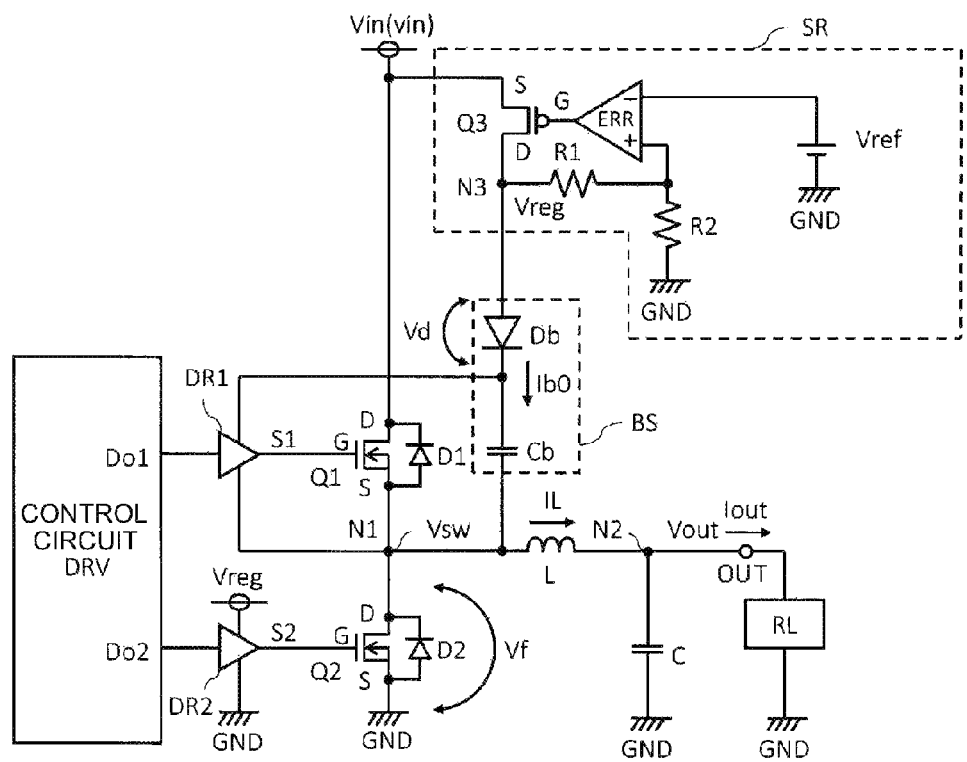
FIG. 7 is a circuit diagram of a synchronous rectification DC/DC converter including a conventional bootstrap circuit.
Figure 8:
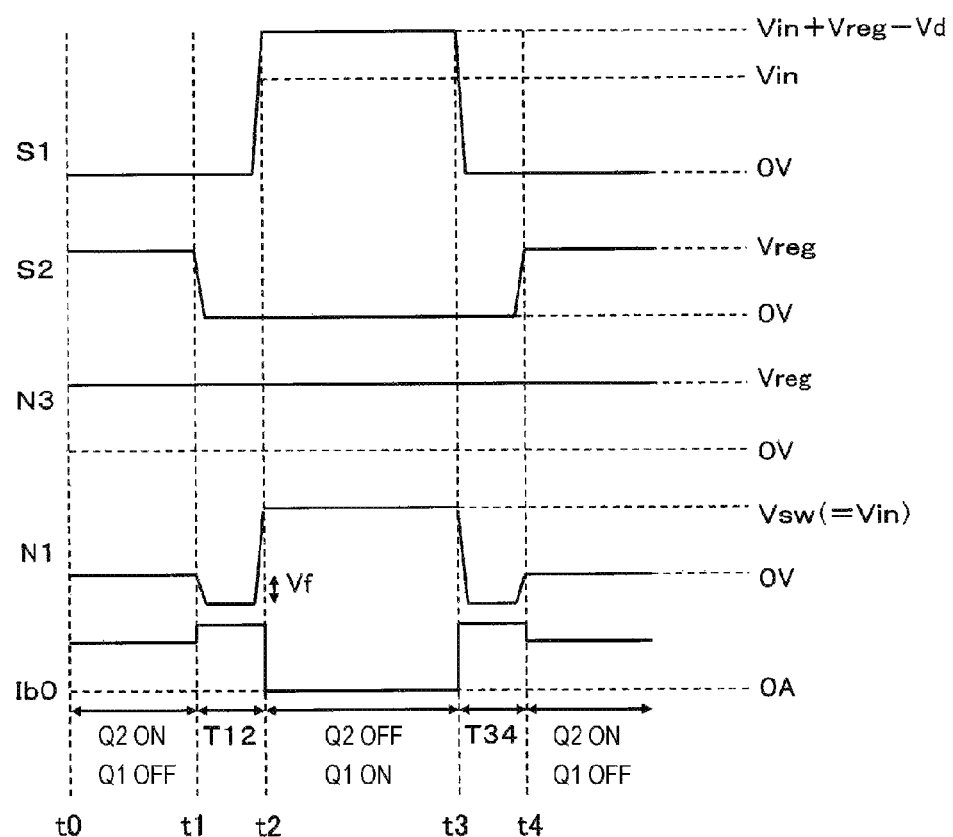
FIG. 8 is a timing chart of the synchronous rectification DC/DC converter including the conventional bootstrap circuit.

A difference between the synchronous rectification step-down DC/DC converter including the bootstrap circuit according to the first embodiment of the present disclosure as illustrated in FIG. 1 and the synchronous rectification step-down DC/DC converter including the conventional bootstrap circuit as illustrated FIG. 7 is the presence of a switch SW.

In FIG. 1, the DC/DC converter includes a control circuit DRV, a first gate driver DR1, a second gate driver DR2, a switching transistor Q1, a synchronous rectification transistor Q2, a series regulator SR, a switch SW, a bootstrap circuit BS, an inductor L, and a capacitor C. The switching transistor Q1 corresponds to a first transistor and the synchronous rectification transistor Q2 corresponds to a second transistor. The switch SW corresponds to a switch and a charging stop circuit. The capacitor C corresponds to a second capacitor.

Although not shown, the control circuit DRV includes, for example, an error amplifier, a PWM comparator, a phase compensation circuit, various protection circuits, a dead time generation circuit, etc. The control circuit DRV switches on/off states of the switching transistor Q1 and the synchronous rectification transistor Q2 complementarily by means of a pulse width modulation or pulse frequency modulation control. The term "complementary" used herein includes a case where the on/off states of the switching transistor Q1 and the synchronous rectification transistor Q2 are completely reversed and a case where a predetermined delay, i.e., dead time, is given to a transition timing of the on/off states of the switching transistor Q1 and the synchronous rectification transistor Q2 from the viewpoint of preventing a through-current.

The first gate driver DR1 and the second gate driver DR2 generate a drive signal S1 and a drive signal S2, respectively, in response to control signals from the control circuit DRV and switch the on/off states of the switching transistor Q1 and the synchronous rectification transistor Q2 complementarily.

NMOS transistors may be used for the switching transistor Q1 and the synchronous rectification transistor Q2. In addition, a parasitic diode D1, which is called a body diode, exists between a source and a drain of the switching transistor Q1. A parasitic diode D2, which is called a body diode, exists between a source and a drain of the synchronous rectification transistor Q2.

The series regulator SR includes a third transistor Q3 and an error amplifier ERR. The series regulator SR is a step-down regulator and is used to lower an input voltage to a predetermined output voltage. A PMOS transistor may be used for the third transistor Q3. Instead of the PMOS transistor, an NMOS transistor may also be used for the third transistor Q3. Instead of a MOS transistor, a bipolar transistor may also be used for the third transistor Q3.

The bootstrap circuit BS includes a diode Db and a capacitor Cb. The bootstrap circuit BS is used to increase a voltage to be applied to a power terminal (high voltage potential terminal) of the first gate driver DR1. Thus, it is possible to increase a voltage to be applied to a gate G of the switching transistor Q1. As a result, it is possible to reliably turn on the switching transistor Q1. The diode Db is, for example, a silicon diode, a Schottky barrier diode, etc. A capacitance of the capacitor Cb is, for example, 0.1 µF to 10 µF. In addition, a transistor may be used instead of the diode Db. Further, the transistor (not shown) may be a kind of diode element, like the diode Db. The capacitor Cb corresponds to a first capacitor.

The switch SW controls non-conduction between the series regulator SR and the bootstrap circuit BS. The switch SW is, for example, a MOS transistor, a bipolar transistor, a thyristor, etc. When a MOS transistor is used for the switch SW, the MOS transistor may be of either an NMOS type or a PMOS type. When a bipolar transistor is used for the switch SW, the bipolar transistor may be of either an NPN type or a PNP type.

A smoothing circuit includes the inductor L and the capacitor C. An inductance of the inductor L is, for example, 0.1 µH to 100 µH. A capacitance of the capacitor C is, for example, 10 µF to 1,000 µF.

Next, the circuit configuration and the circuit connection of the DC/DC converter including the bootstrap circuit of FIG. 1 are described below.

A first output terminal Do1 of the control circuit DRV is connected to an input terminal of the first gate driver DR1. A second output terminal Do2 of the control circuit DRV is connected to an input terminal of the second gate driver DR2. A third output terminal Do3 of the control circuit DRV is connected to the switch SW. An output terminal of the first gate driver DR1 is connected to the gate G (serving as a control electrode) of the switching transistor Q1. An output terminal of the second gate driver DR2 is connected to a gate G (serving as a control electrode) of the synchronous rectification transistor Q2. The drain D of the switching transistor Q1 is connected to a power terminal (high voltage potential terminal) Vin. The source S of the switching transistor Q1 is connected to a node N1. The drain D of the synchronous rectification transistor Q2 is connected to the node N1. The source S of the synchronous rectification transistor Q2 is connected to a ground terminal (low voltage potential terminal) GND. The inductor L is connected between the node N1 and a node N2. The capacitor C is connected between the node N2 and the ground terminal (low voltage potential terminal) GND. The smoothing circuit includes the inductor L and the capacitor C. The node N2 is connected to an output terminal OUT. A load RL is connected to the output terminal OUT. A CPU, a GPU, a memory, or the like is connected as the load RL. In addition, the source S of the switching transistor Q1 and the drain D of the synchronous rectification transistor Q2 correspond to main electrodes. The node N1 corresponds to a common node.

A source S of the third transistor Q3 is connected to the power terminal (high voltage potential terminal) Vin. In addition, the source S of the third transistor Q3 may be connected to a power terminal (not shown) different from the power terminal (high voltage potential terminal) Vin. A drain D of the third transistor Q3 is connected to a node N3. A gate G of the third transistor Q3 is connected to an output terminal of the error amplifier ERR. A non-inverting input terminal (+) of the error amplifier ERR is connected to the node N3. A reference voltage Vref is applied to an inverting input terminal (−) of the error amplifier ERR. The series regulator SR includes the third transistor Q3 and the error amplifier ERR. The reference voltage Vref is, for example, 1V to 20V.

The switch SW is connected between the node N3 and an anode of the diode Db.

The capacitor Cb is connected between the node N1 and a cathode of the diode Db. The bootstrap circuit BS includes the capacitor Cb and the diode Db.

The power terminal (high voltage potential terminal) of the first gate driver DR1 is connected to the cathode of the diode Db. The ground terminal (low voltage potential terminal) of the first gate driver DR1 is connected to the node N1. For example, the output voltage Vreg of the series regulator SR is applied to the power terminal (high voltage potential terminal) of the second gate driver DR2. The ground terminal (low voltage potential terminal) of the second gate driver DR2 is grounded. In addition, the ground terminal (low voltage potential terminal) of the first gate driver DR1 may be grounded.

Next, the signal flow and the circuit operation of the DC/DC converter including the bootstrap circuit of FIG. 1 are described below.

The control circuit DRV inputs a control signal to each of the first gate driver DR1 and the second gate driver DR2, for example, in response to a signal from an internal PWM comparator (not shown) of the control circuit DRV.

The first gate driver DR1 amplifies the control signal from the control circuit DRV and generates the drive signal S1. The switching transistor Q1 is driven by the drive signal S1. The second gate driver DR2 amplifies the control signal from the control circuit DRV and generates the drive signal S2. The synchronous rectification transistor Q2 is driven by the drive signal S2. Thus, the switching transistor Q1 and the synchronous rectification transistor Q2 are turned on or off in a complementary manner, and a current IL flows into the inductor L. The current IL is smoothed by the capacitor C and an output voltage Vout is generated on the output terminal OUT. When the load RL is connected to the output terminal OUT, an output current Iout is outputted. The output current Iout flowing in the output terminal OUT is, for example, 0 A to 20 A. A supply voltage yin of the power terminal (high voltage potential terminal) Vin is, for example, 2.7V to 100V. The output voltage Vout outputted to the output terminal OUT is, for example, 0.6V to 100V.

The error amplifier ERR in the series regulator SR compares the reference voltage Vref and the supply voltage yin of the power terminal (high voltage potential terminal) Vin, and controls an on/off state of the third transistor Q3. As a result, the predetermined voltage Vreg is supplied to the bootstrap circuit BS.

Due to the output voltage Vreg of the series regulator SR, a charging current Ib flows into the diode Db of the bootstrap circuit BS and the capacitor Cb is charged. Thus, a sum of the supply voltage yin and a voltage Vreg−Vd (which is the voltage that is lowered from the output voltage Vreg of the series regulator SR by a forward voltage Vd of the diode Db), i.e., a voltage vin+Vreg−Vd, is applied to the power terminal (high voltage potential terminal) of the first gate driver DR1. This voltage higher than the supply voltage yin ensures that the switching transistor Q1 is turned on. On the other hand, since the ground terminal (low voltage potential terminal) of the first gate driver DR1 is connected to the node N1, the ground terminal has a voltage of 0V when the switching transistor Q1 is in the off state and the synchronous rectification transistor Q2 is in the on state. As described above, the bootstrap circuit BS sets a high level H of the drive signal S1 to the sum of the supply voltage yin and the voltage Vreg−Vd (which is the voltage that is lowered from the output voltage Vreg of the series regulator SR by the forward voltage Vd of the diode Db), i.e., the voltage vin+Vreg−Vd. A low level L of the drive signal S1 is 0V. As such, the high level H of the drive signal S1 is set to a voltage higher, for example, by 3V to 5V than the supply voltage yin of the power terminal (high voltage potential terminal) Vin.

Figure 2:
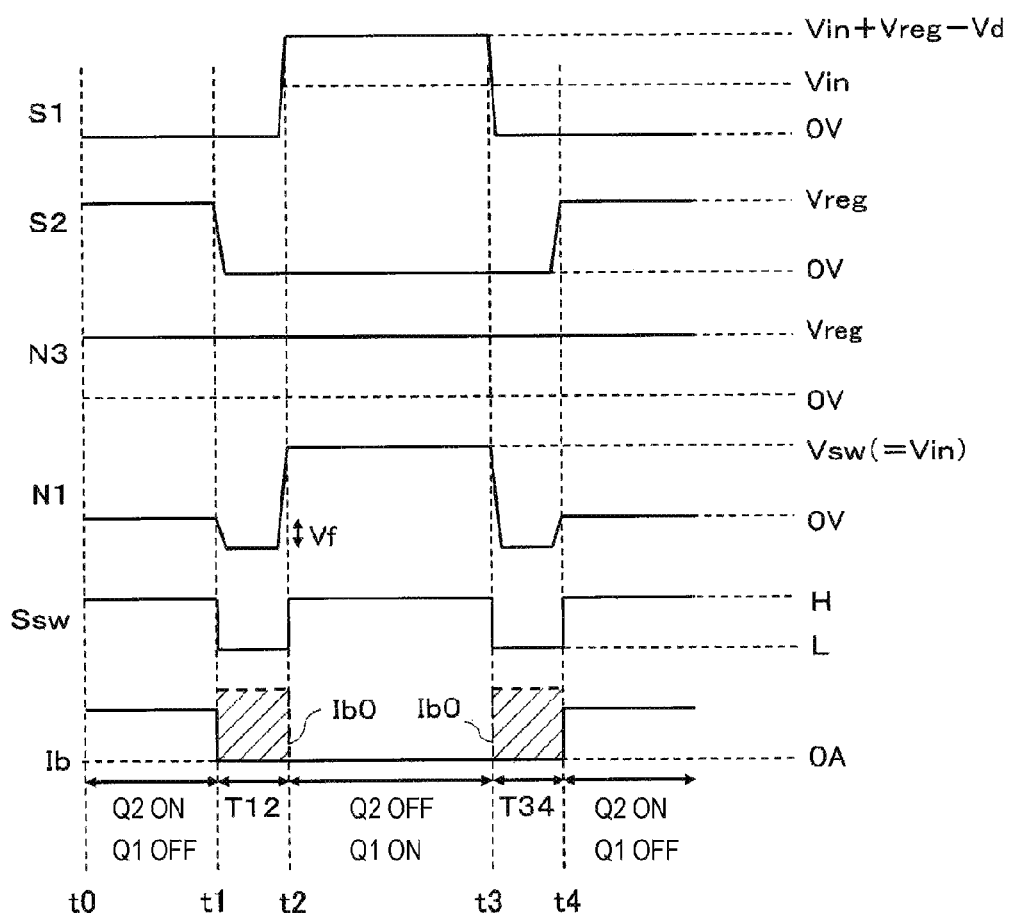
FIG. 2 is a timing chart of the synchronous rectification step-down DC/DC converter including the bootstrap circuit according to the first embodiment of the present disclosure.

FIG. 2 is a timing chart of the DC/DC converter of FIG. 1. Hereinafter, the operation of the DC/DC converter is described below with reference to FIGS. 1 and 2.

In a time period from time t0 to time t1, since the level of the drive signal S1 is 0V, the switching transistor Q1 is in the off state. Since the level of the drive signal S2 is Vreg, the synchronous rectification transistor Q2 is in the on state. In addition, the level of the node N3 is Vreg and the level of the node N1 is approximately 0V. A switch signal Ssw has a high level H. When the switch signal Ssw has the high level H, the switch SW is switched on and the series regulator SR is connected to the bootstrap circuit BS. Accordingly, the capacitor Cb is charged as the charging current Ib flows into the capacitor Cb. Prior to time t0, for example, the energy is stored in the inductor L and a voltage due to a counter-electromotive force is generated across the inductor L. Therefore, in the time period from time t0 to time t1, the current IL flows from the ground terminal (low voltage potential terminal) GND into the inductor L through the synchronous rectification transistor Q2.

In a time period T12 from time t1 to time t2, since the level of the drive signal S1 is 0V, the switching transistor Q1 is in the off state. Since the level of the drive signal S2 is changed from Vreg to 0V, the synchronous rectification transistor Q2 is switched from the on state to the off state. Here, the parasitic diode D2 exists in the synchronous rectification transistor Q2. In addition, the energy is stored in the inductor L and a voltage due to a counter-electromotive force is generated across the inductor L. Thus, the current IL flows from the ground terminal (low voltage potential terminal) GND into the inductor L through the parasitic diode D2. Therefore, a voltage drop corresponding to a forward voltage Vf of the parasitic diode D2 occurs on the node N1 and the level of the node N1 is changed from 0V to −Vf. Here, when the switching transistor Q1 and the synchronous rectification transistor Q2 are turned off, the switch signal Ssw is switched from the high level H to a low level L. In this operation, since the switch SW cuts off the conduction between the series regulator SR and the bootstrap circuit BS, the charging current Ib does not flows into the capacitor Cb.

In a time period from time t2 to time t3, since the level of the drive signal S1 is changed from 0V to vin+Vreg−Vd by the bootstrap circuit BS, the switching transistor Q1 is switched from the off state to the on state. On the other hand, since the level of the drive signal S2 remains at 0V, the synchronous rectification transistor Q2 remains in the off state. In addition, the level of the node N3 remains at Vreg. When the switch signal Ssw is switched from the low level L to the high level H, the level of the node N1 is changed from −Vf to Vsw. Therefore, in this operation, the charging current Ib does not flow into the capacitor Cb. In addition, since the current IL flows from the power terminal (high voltage potential terminal) Vin into the inductor L through the switching transistor Q1, the energy is stored in the inductor L.

In a time period from T34 time t3 to time t4, since the level of the drive signal S1 is changed from vin+Vreg−Vd to 0V, the switching transistor Q1 is switched from the on state to the off state. Since the level of the drive signal S2 is 0V, the synchronous rectification transistor Q2 remains in the off state. In this operation, the energy is stored in the inductor L and a voltage due to a counter-electromotive force is generated across the inductor L. Thus, the current IL flows from the ground terminal (low voltage potential terminal) GND into the inductor L through the parasitic diode D2. Accordingly, a voltage drop corresponding to the forward voltage Vf of the parasitic diode D2 occurs on the node N1 and the level of the node N1 is changed from Vsw to −Vf. In addition, the level of the node N3 remains at Vreg. Here, when the switching transistor Q1 and the synchronous rectification transistor Q2 are turned off, the switch signal Ssw is again switched from the high level H to the low level L. In this operation, since the switch SW cuts off the conduction between the series regulator SR and the bootstrap circuit BS, the charging current Ib does not flow into the capacitor Cb.

After time t4, the same operation as in the time period from time t0 to time t4 is repeated.

As described above, during the time period from time t0 to time t4, in the DC/DC converter of the first embodiment of the present disclosure, when the switching transistor Q1 and the synchronous rectification transistor Q2 are turned off (i.e., during the time period T12 and the time period T34), the switch SW cuts off the conduction between the series regulator SR and the bootstrap circuit BS. Accordingly, when the switching transistor Q1 and the synchronous rectification transistor Q2 are turned off, the charging current Ib does not flow into the capacitor Cb. This results in a decrease in power consumption of the DC/DC converter by the charging current Ib0 flowing in the time period T12 and the time period T34 in the conventional DC/DC converter of FIG. 7.

Second Embodiment

Figure 3:
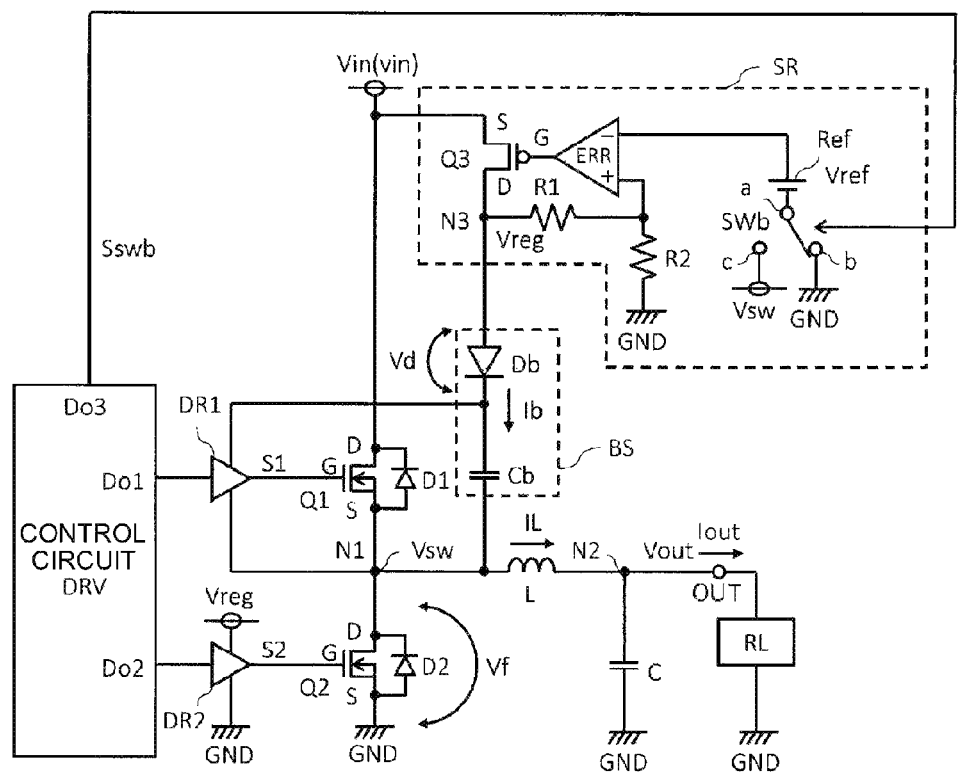
FIG. 3 is a circuit diagram of a synchronous rectification step-down DC/DC converter including a bootstrap circuit according to a second embodiment of the present disclosure.

FIG. 3 is a circuit diagram of a synchronous rectification step-down DC/DC converter including a bootstrap circuit according to a second embodiment of the present disclosure. The second embodiment of the present disclosure is described below with reference to the drawings.

The synchronous rectification step-down DC/DC converter including the bootstrap circuit according to the second embodiment of the present disclosure as illustrated in FIG. 3 has substantially the same configuration as the synchronous rectification step-down DC/DC converter including the bootstrap circuit according to the first embodiment of the present disclosure as illustrated in FIG. 1. In the synchronous rectification step-down DC/DC converter including the bootstrap circuit according to the second embodiment of the present disclosure as illustrated in FIG. 3, no switch SW exists between the series regulator SR and the bootstrap circuit BS but a switch SWb exists in the series regulator SR. The switch SWb is, for example, a MOS transistor, a bipolar transistor, a thyristor, etc. When a MOS transistor is used for the switch SWb, the MOS transistor may be of either an NMOS type or a PMOS type. In addition, the switch SWb corresponds to a switch and a charging stop circuit.

The circuit configuration and the circuit connection of the series regulator SR are described below. The source S of the third transistor Q3 is connected to the power terminal (high voltage potential terminal) Vin. In addition, the source S of the third transistor Q3 may be connected to a high voltage potential terminal (not shown) different from the power terminal (high voltage potential terminal) Vin. The drain D of the third transistor Q3 is connected to a node N3. The gate G (serving as a control electrode) of the third transistor Q3 is connected to the output terminal of the error amplifier ERR. The non-inverting input terminal (+) of the error amplifier ERR is connected to the node N3. The inverting input terminal (−) of the error amplifier ERR is connected to one end (e.g., positive electrode) of a reference voltage source Ref. The other end (e.g., negative electrode) of the reference voltage source Ref is connected to a midpoint a of the switch SWb. A contact point b of the switch SWb is connected to the ground terminal (low voltage potential terminal) GND. A contact point c of the switch SWb is connected to the node N1. A voltage to be applied to the inverting input terminal (−) of the error amplifier ERR is switched by the switch SWb.

In addition, in the synchronous rectification step-down DC/DC converter including the bootstrap circuit according to the second embodiment of the present disclosure as illustrated in f FIG. 3, since no switch SW exists between the series regulator SR and the bootstrap circuit BS, the anode of the diode Db is connected to the node N3. The diode Db corresponds to a diode element.

Next, the signal flow and the circuit operation of the DC/DC converter including the bootstrap circuit of FIG. 3 are described below.

The error amplifier ERR compares the reference voltage Vref and the supply voltage yin of the power terminal (high voltage potential terminal) Vin, and controls the on/off state of the third transistor Q3. Thus, the predetermined voltage Vreg is supplied to the bootstrap circuit BS.

The switch SWb is connected to the contact point b normally. When the switching transistor Q1 and the synchronous rectification transistor Q2 are turned off, the connection of the switch SWb is switched from the contact point b to the contact point c by a switch signal Sswb. When the switching transistor Q1 is turned off and the synchronous rectification transistor Q2 is turned on, the voltage of the node N1 is 0V and the output voltage of the bootstrap circuit BS is Vreg. On the other hand, when the switching transistor Q1 and the synchronous rectification transistor Q2 are turned off, the voltage of the node N1 is −Vf and the output voltage of the bootstrap circuit BS is Vreg−Vf. As such, a difference between the output voltage of the bootstrap circuit BS and the voltage of the node N1 is constant. Therefore, when the switching transistor Q1 and the synchronous rectification transistor Q2 are turned off, the charging current Ib does not flow into the capacitor Cb. The switching transistor Q1 corresponds to a first transistor and the synchronous rectification transistor Q2 corresponds to a second transistor. The node N1 corresponds to a common node. The capacitor Cb corresponds to a first capacitor.

Figure 4:
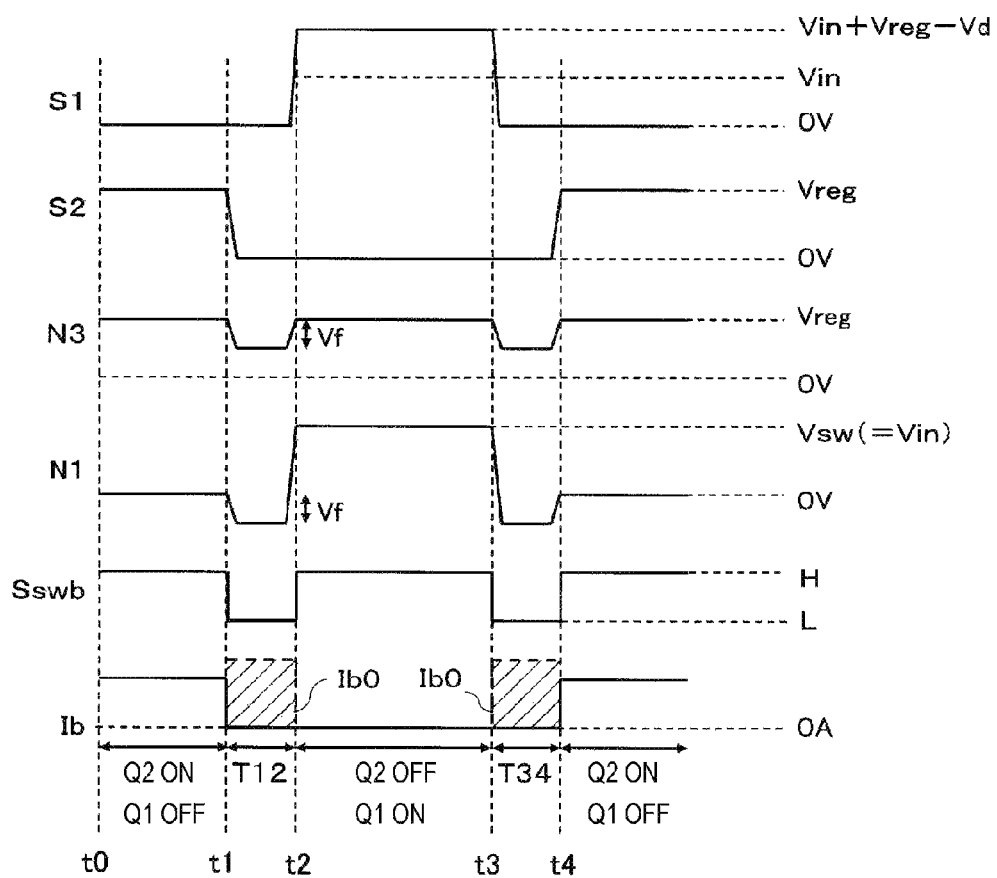
FIG. 4 is a timing chart of the synchronous rectification step-down DC/DC converter including the bootstrap circuit according to the second embodiment of the present disclosure.

FIG. 4 is a timing chart of the DC/DC converter of FIG. 3. Hereinafter, the operation of the DC/DC converter is described below with reference to FIGS. 3 and 4.

In a time period from time t0 to time t1, since the level of the drive signal S1 is 0V, the switching transistor Q1 is in the off state. Since the level of the drive signal S2 is Vreg, the synchronous rectification transistor Q2 is in the on state. In addition, the level of the node N3 is Vreg and the level of the node N1 is 0V. The switch signal Sswb has a high level H. When the switch signal Sswb has the high level H, the switch SWb is connected to the contact point b. Therefore, the capacitor Cb is charged as the charging current Ib flows into the capacitor Cb. Prior to time t0, for example, the energy is stored in the inductor L and a voltage due to a counter-electromotive force is generated across the inductor L. Therefore, in the time period from time t0 to time t1, the current IL flows from the ground terminal (low voltage potential terminal) GND through the synchronous rectification transistor Q2 and the inductor L.

In a time period T12 from time t1 to time t2, since the level of the drive signal S1 is 0V, the switching transistor Q1 is in the off state. Since the level of the drive signal S2 is changed from Vreg to 0V, the synchronous rectification transistor Q2 is switched from the on state to the off state. Here, the parasitic diode D2 exists in the synchronous rectification transistor Q2. In addition, the energy is stored in the inductor L and a voltage due to a counter-electromotive force is generated across the inductor L. Thus, the current IL flows from the ground terminal (low voltage potential terminal) GND into the inductor L through the parasitic diode D2. Therefore, a voltage drop corresponding to a forward voltage Vf of the parasitic diode D2 occurs on the node N1 and the level of the node N1 is changed from 0V to −Vf. Here, when the switching transistor Q1 and the synchronous rectification transistor Q2 are turned off, the switch signal Sswb is switched from the high level H to a low level L. In this operation, since the connection of the switch SWb is switched from the contact point b to the contact point c, the output voltage of the series regulator SR is Vreg−Vf. Therefore, the level of the node N3 is Vreg−Vf. Since there is no change in voltage across the capacitor Cb, the charging current Ib does not flow into the capacitor Cb.

In a time period from time t2 to time t3, since the level of the drive signal S1 is changed from 0V to vin+Vreg−Vd by the bootstrap circuit BS, the switching transistor Q1 is changed from the off state to the on state. On the other hand, since the level of the drive signal S2 remains at 0V, the synchronous rectification transistor Q2 remains in the off state. In addition, the level of the node N3 remains at Vreg. In addition, when the switch signal Sswb is switched from the low level L to the high level H, the level of the node N3 is changed from Vreg−Vf to Vreg. The level of the node N1 is changed from −Vf to Vsw. Therefore, in this operation, the charging current Ib does not flow into the capacitor Cb. In addition, since the current IL flows from the power terminal (high voltage potential terminal) Vin into the inductor L through the switching transistor Q1, the energy is stored in the inductor L.

In a time period from T34 time t3 to time t4, since the level of the drive signal S1 is changed from vin+Vreg−Vd to 0V, the switching transistor Q1 is switched from the on state to the off state. Since the level of the drive signal S2 is 0V, the synchronous rectification transistor Q2 remains in the off state. In this operation, the energy is stored in the inductor L and a voltage due to a counter-electromotive force is generated across the inductor L. Thus, the current IL flows from the ground terminal (low voltage potential terminal) GND into the inductor L through the parasitic diode D2. Accordingly, a voltage drop corresponding to the forward voltage Vf of the parasitic diode D2 occurs on the node N1 and the level of the node N1 is changed from Vsw to −Vf. In addition, the level of the node N3 remains at Vreg. Here, when the switching transistor Q1 and the synchronous rectification transistor Q2 are turned off, the switch signal Sswb is again switched from the high level H to the low level L. In this operation, since the connection of the switch SWb is changed from the contact point b to the contact point c, the output voltage of the series regulator SR is Vreg−Vf. Therefore, the level of the node N3 is Vreg−Vf. Since there is no change in voltage across the capacitor Cb, the charging current Ib does not flow into the capacitor Cb.

After time t4, the same operation as in the time period from time t0 to time t4 is repeated As described above, during the time period from time t0 to time t4, in the DC/DC converter of the second embodiment of the present disclosure, when the switching transistor Q1 and the synchronous rectification transistor Q2 are turned off (i.e., during the time period T12 and the time period T34), the connection of the switch SWb is switched from the contact point b to the contact point c. Thus, when the switching transistor Q1 and the synchronous rectification transistor Q2 are turned off, since there is no change in voltage across the capacitor Cb, the charging current Ib does not flow into the capacitor Cb. This results in a decrease in power consumption of the DC/DC converter by the charging current Ib0 flowing in the time period T12 and the time period T34 in the conventional DC/DC converter of FIG. 7.

Third Embodiment

Figure 5:
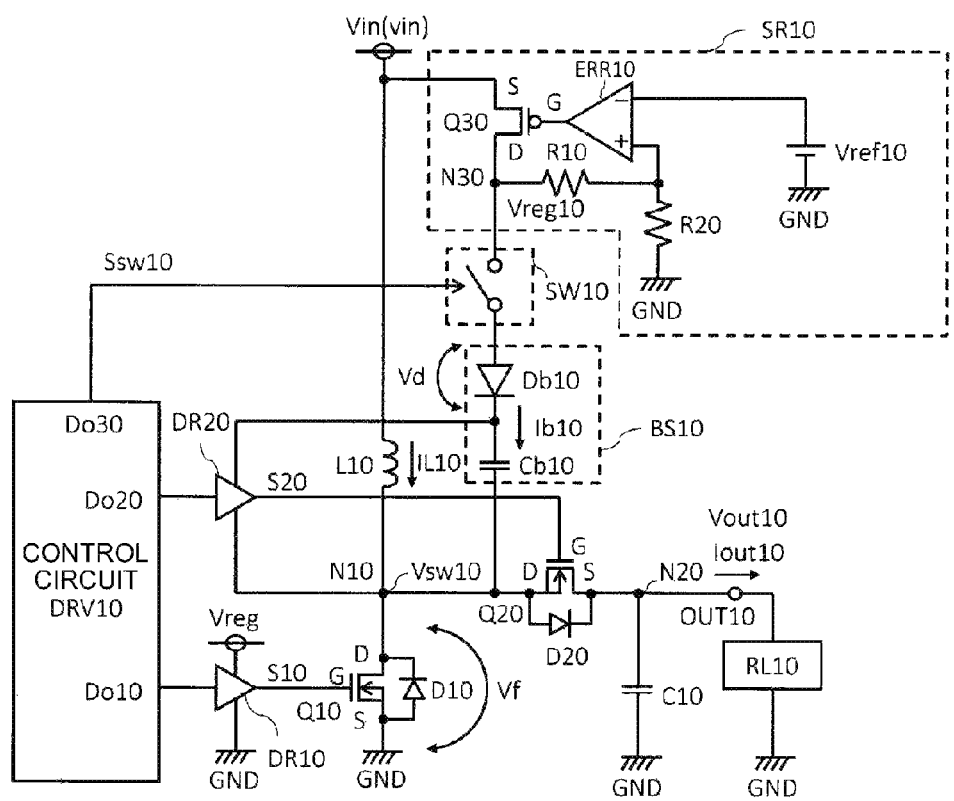
FIG. 5 is a circuit diagram of a synchronous rectification step-up DC/DC converter including a bootstrap circuit according to a third embodiment of the present disclosure.

FIG. 5 is a circuit diagram of a synchronous rectification step-up DC/DC converter including the bootstrap circuit according to a third embodiment of the present disclosure. The third embodiment of the present disclosure is described below with reference to the drawings. Those having the same functions are denoted by the same reference numerals, and explanations for them are not repeated.

In FIG. 5, the DC/DC converter includes a control circuit DRV10, a first gate driver DR10, a second gate driver DR20, a switching transistor Q10, a synchronous rectification transistor Q20, a series regulator SR10, a switch SW10, a bootstrap circuit BS10, an inductor L10 and a capacitor C10. The switching transistor Q10 corresponds to a second transistor and the synchronous rectification transistor Q20 corresponds to a first transistor. The switch SW10 corresponds to a switch and a charging stop circuit.

Although not shown, the control circuit DRV10 includes, for example, an error amplifier, a PWM comparator, a phase compensation circuit, various protection circuits, a dead time generation circuit, etc. The control circuit DRV10 switches on/off states of the switching transistor Q10 and the synchronous rectification transistor Q20 complementarily by means of pulse width modulation or pulse frequency modulation control. The term "complementary" used herein includes a case where the on/off states of the switching transistor Q10 and the synchronous rectification transistor Q20 is completely reversed and a case where a predetermined delay, i.e., dead time, is given to a transition timing of the on/off states of the switching transistor Q10 and the synchronous rectification transistor Q20 from the viewpoint of prevention of a through-current.

The first gate driver DR10 and the second gate driver DR20 generate a drive signal S10 and a drive signal S20, respectively, in response to control signals from the control circuit DRV10 and switch the on/off states of the switching transistor Q10 and the synchronous rectification transistor Q20 complementarily.

NMOS transistors may be used for the switching transistor Q10 and the synchronous rectification transistor Q20. In addition, a parasitic diode D10 exists between a source and a drain of the switching transistor Q10. A parasitic diode D20 exists between a source and a drain of the synchronous rectification transistor Q20. Instead of MOS transistors, bipolar transistors may also be used for the switching transistor Q10 and the synchronous rectification transistor Q20.

The series regulator SR10 includes a third transistor Q30 and an error amplifier ERR10. The series regulator SR10 is configured to obtain a predetermined voltage by controlling a voltage across the third transistor Q30 finely by increasing or decreasing a driving force of the third transistor Q30 connected in series to a current flowing path, thereby providing excellent accuracy of an output voltage. A PMOS transistor may be used for the third transistor Q30. Instead of the PMOS transistor, an NMOS transistor may also be used for the third transistor Q30. Instead of a MOS transistor, a bipolar transistor may also be used for the third transistor Q30.

The bootstrap circuit BS10 includes a diode Db10 and a capacitor Cb10. The bootstrap circuit BS10 is used to increase a voltage to be applied to a power terminal (high voltage potential terminal) of the second gate driver DR20. Thus, it is possible to increase a voltage to be applied to a gate G of the synchronous rectification transistor Q20. As a result, it is possible to reliably turn on the synchronous rectification transistor Q20. The diode Db10 is, for example, a silicon diode, a Schottky barrier diode, etc. In addition, a transistor may be used instead of the diode Db10. The diode Db10 corresponds to a diode element. The capacitor Cb10 corresponds to a first capacitor.

The switch SW10 is used to cut off conduction between the series regulator SR10 and the bootstrap circuit BS10. The switch SW10 is, for example, a MOS transistor, a bipolar transistor, a thyristor, etc. When a MOS transistor is used for the switch SW10, the MOS transistor may be of either an NMOS type or a PMOS type.

A smoothing circuit is includes the inductor L10 and the capacitor C10.

Next, the circuit configuration and the circuit connection of the DC/DC converter including the bootstrap circuit of FIG. 5 are described below.

A first output terminal Do10 of the control circuit DRV10 is connected to an input terminal of the first gate driver DR10. A second output terminal Do20 of the control circuit DRV10 is connected to an input terminal of the second gate driver DR20. A third output terminal Do30 of the control circuit DRV10 is connected to the switch SW10. An output terminal of the first gate driver DR10 is connected to the gate G (serving as a control electrode) of the switching transistor Q10. An output terminal of the second gate driver DR20 is connected to a gate G (serving as a control electrode) of the synchronous rectification transistor Q20. The drain D of the switching transistor Q10 is connected to a node N10. The source S of the switching transistor Q1 is connected to a ground terminal (low voltage potential terminal) GND. The drain D of the synchronous rectification transistor Q20 is connected to the node N10. The source S of the synchronous rectification transistor Q20 is connected to a node N20. The inductor L10 is connected between a power terminal (high voltage potential terminal) Vin and the node N10. The capacitor C10 is connected between the node N20 and the ground terminal (low voltage potential terminal) GND. The node N20 is connected to an output terminal OUT10. A load RL10 is connected to the output terminal OUT10. A motor, a piezo element, or the like is connected as the load RL10. In addition, the drain D of the switching transistor Q10 and the source S of the synchronous rectification transistor Q20 correspond to main electrodes. The node N10 corresponds to a common node. The capacitor C10 corresponds to a second capacitor.

A source S of the third transistor Q30 is connected to the power terminal (high voltage potential terminal) Vin. In addition, A source S of the third transistor Q30 may be connected to a power terminal (not shown) different from the power terminal (high voltage potential terminal) Vin. A drain D of the third transistor Q30 is connected to a node N30. The gate G (serving as a control electrode) of the third transistor Q30 is connected to an output terminal of the error amplifier ERR10. A non-inverting input terminal (+) of the error amplifier ERR10 is connected to the node N30. A reference voltage Vref10 is applied to an inverting input terminal (−) of the error amplifier ERR10. The series regulator SR10 includes the third transistor Q30 and the error amplifier ERR10. The reference voltage Vref10 is, for example, 1V to 20V.

The switch SW10 is connected between the node N30 and an anode of the diode Db10.

The capacitor Cb10 is connected between the node N10 and a cathode of the diode Db10. The bootstrap circuit BS10 includes the capacitor Cb10 and the diode Db10.

For example, the output voltage Vreg10 of the series regulator SR10 is applied to the power terminal (high voltage potential terminal) of the first gate driver DR10. The ground terminal (low voltage potential terminal) of the first gate driver DR10 is grounded. The power terminal (high voltage potential terminal) of the second gate driver DR20 is connected to the cathode of the diode Db10. The low voltage potential terminal of the second gate driver DR20 is connected to the node N10. In addition, the low voltage potential terminal of the second gate driver DR20 may be grounded.

Next, the signal flow and the circuit operation of the DC/DC converter including the bootstrap circuit of FIG. 5 are described below.

The control circuit DRV10 inputs a control signal to each of the first gate driver DR10 and the second gate driver DR20, for example, in response to a signal from an internal PWM comparator (not shown) of the control circuit DRV10.

The first gate driver DR10 amplifies the control signal from the control circuit DRV10 and generates the drive signal S10. The switching transistor Q10 is driven by the drive signal S10. The second gate driver DR20 amplifies the control signal from the control circuit DRV10 and generates the drive signal S20. The synchronous rectification transistor Q20 is driven by the drive signal S20. Thus, the switching transistor Q10 and the synchronous rectification transistor Q20 are turned on or off in a complementary manner and a current IL10 flows into the inductor L10. The current IL10 is smoothed by the capacitor C10 and an output voltage Vout10 is generated on the output terminal OUT10. When the load RL10 is connected to the output terminal OUT10, an output current Iout10 is outputted.

The error amplifier ERR10 in the series regulator SR10 compares the reference voltage Vref10 and the supply voltage yin of the power terminal (high voltage potential terminal) Vin and controls an on/off state of the third transistor Q30. As a result, the predetermined voltage Vreg10 is supplied to the bootstrap circuit BS10.

Due to the output voltage Vreg10 of the series regulator SR10, a charging current Ib10 flows into the diode Db10 of the bootstrap circuit BS and the capacitor Cb10 is charged. Thus, a sum of the supply voltage vin and a voltage Vreg10−V (which is the voltage that is lowered from the output voltage Vreg10 of the series regulator SR10 by a forward voltage Vd of the diode Db10), i.e., a voltage vin+Vreg10−Vd, is applied to the power terminal (high voltage potential terminal) of the second gate driver DR20. This voltage higher than the supply voltage yin ensures that the synchronous rectification transistor Q20 is turned on. On the other hand, since the ground terminal (low voltage potential terminal) of the second gate driver DR20 is connected to the node N10, the ground terminal has a voltage of 0V when the switching transistor Q10 is in the on state and the synchronous rectification transistor Q20 is in the off state. As described above, the bootstrap circuit BS10 sets a high level H of the drive signal S20 to the sum of the supply voltage yin and the voltage Vreg10−Vd (which is the voltage that is lowered from the output voltage Vreg10 of the series regulator SR10 by the forward voltage Vd of the diode Db10), i.e., the voltage vin+Vreg10−Vd. A low level L of the drive signal S20 is 0V. Thus, the high level H of the drive signal S20 is set to a voltage higher by, for example, 3V to 5V than the supply voltage yin of the power terminal (high voltage potential terminal) Vin.

As described above, in the DC/DC converter of the third embodiment of the present disclosure, like the DC/DC converter of the first embodiment of the present disclosure, when the switching transistor Q10 and the synchronous rectification transistor Q20 are turned off, the switch SW10 cuts off the conduction between the series regulator SR10 and the bootstrap circuit BS10 by means of the switch signal Ssw10. Therefore, when the switching transistor Q10 and the synchronous rectification transistor Q20 are turned off, the charging current Ib10 does not flow into the capacitor Cb10. This results in a decrease in power consumption of the DC/DC converter.

Fourth Embodiment

Figure 6:
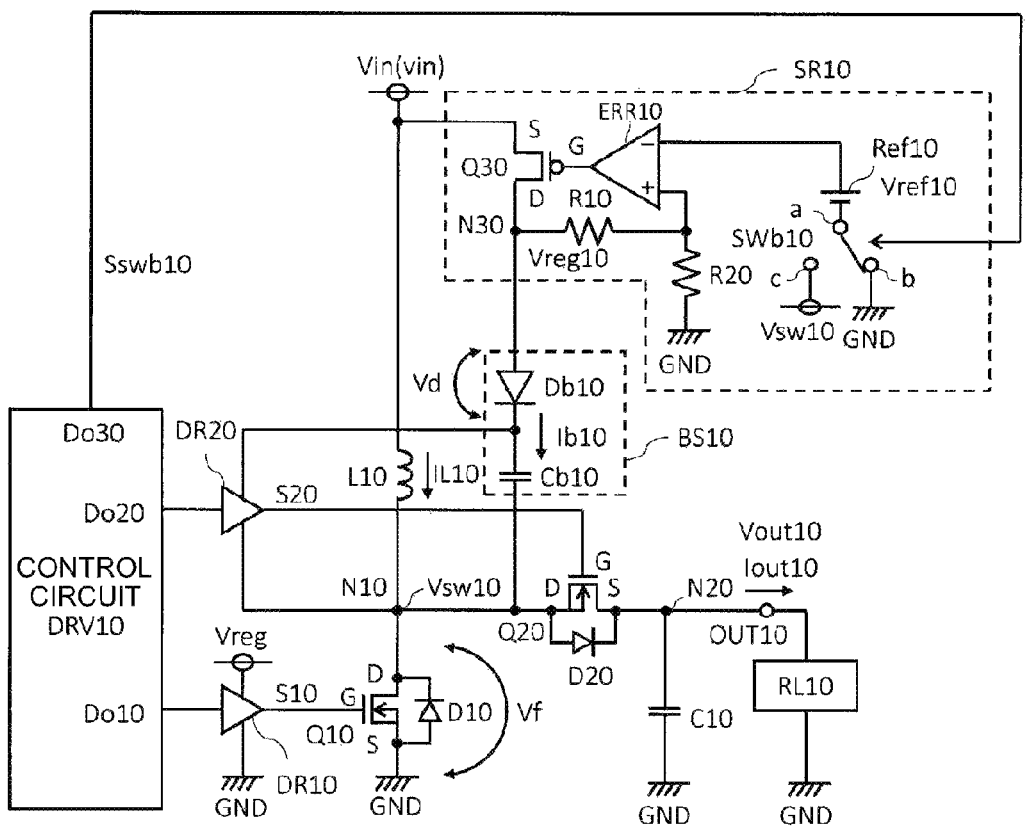
FIG. 6 is a circuit diagram of a synchronous rectification step-up DC/DC converter including a bootstrap circuit according to a fourth embodiment of the present disclosure.

FIG. 6 is a circuit diagram of a synchronous rectification step-up DC/DC converter including a bootstrap circuit according to a fourth embodiment of the present disclosure. The fourth embodiment of the present disclosure is described below with reference to the drawings.

The synchronous rectification step-up DC/DC converter including the bootstrap circuit according to the fourth embodiment of the present disclosure as illustrated in FIG. 6 has substantially the same configuration as the synchronous rectification step-up DC/DC converter including the bootstrap circuit according to the third embodiment of the present disclosure as illustrated in FIG. 5. In the synchronous rectification step-up DC/DC converter including the bootstrap circuit according to the fourth embodiment of the present disclosure as illustrated in FIG. 6, no switch SW10 exists between the series regulator SR10 and the bootstrap circuit BS10 but a switch SWb10 exists in the series regulator SR10. The switch SWb10 is, for example, a MOS transistor, a bipolar transistor, a thyristor, etc. When a MOS transistor is used for the switch SWb10, the MOS transistor may be of either an NMOS type or a PMOS type. In addition, the switch SWb10 corresponds to a switch and a charging stop circuit.

The circuit configuration and the circuit connection of the series regulator SR10 are described below. The source S of the third transistor Q30 is connected to the power terminal (high voltage potential terminal) Vin. In addition, the source S of the third transistor Q30 may be connected to a high voltage potential terminal (not shown) different from the power terminal (high voltage potential terminal) Vin. The drain D of the third transistor Q30 is connected to a node N30. The gate G (serving as a control electrode) of the third transistor Q30 is connected to the output terminal of the error amplifier ERR10. The non-inverting input terminal (+) of the error amplifier ERR10 is connected to the node N30. The inverting input terminal (−) of the error amplifier ERR10 is connected to one end (e.g., positive electrode) of a reference voltage source Ref10. The other end (e.g., negative electrode) of the reference voltage source Ref10 is connected to the midpoint a of the switch SWb10. A contact point b of the switch SWb10 is connected to the ground terminal (low voltage potential terminal) GND. A contact point c of the switch SWb10 is connected to the node N10. A voltage to be applied to the inverting input terminal (−) of the error amplifier ERR10 is switched by the switch SWb10.

In addition, in the synchronous rectification step-up DC/DC converter including the bootstrap circuit according to the fourth embodiment of the present disclosure as illustrated in FIG. 6, since no switch SW10 exists between the series regulator SR10 and the bootstrap circuit BS10, the anode of the diode Db10 is connected to the node N30. The diode Db10 corresponds to a diode element.

Next, the signal flow and the circuit operation of the DC/DC converter including the bootstrap circuit of FIG. 6 are described below.

The error amplifier ERR10 compares the reference voltage Vref10 and the supply voltage yin of the power terminal (high voltage potential terminal) Vin and controls the on/off state of the third transistor Q30. Thus, the predetermined voltage Vreg10 is supplied to the bootstrap circuit BS10.

The switch SWb10 is connected to the contact point b normally. When the switching transistor Q10 and the synchronous rectification transistor Q20 are turned off, the connection of the switch SWb10 is switched from the contact point b to the contact point c by a switch signal Sswb10. When the switching transistor Q10 is turned off and the synchronous rectification transistor Q20 is turned on, the voltage of the node N10 is 0V and the output voltage of the bootstrap circuit BS10 is Vreg10. On the other hand, when the switching transistor Q10 and the synchronous rectification transistor Q20 are turned off, the voltage of the node N10 is −Vf and the output voltage of the bootstrap circuit BS10 is Vreg10−Vf. As such, a difference between the output voltage of the bootstrap circuit BS10 and the voltage of the node N10 is constant. Therefore, when the switching transistor Q10 and the synchronous rectification transistor Q20 are turned off, the charging current Ib10 does not flow into the capacitor Cb10. The switching transistor Q10 corresponds to a second transistor and the synchronous rectification transistor Q20 corresponds to a first transistor. The node N10 corresponds to a common node. The capacitor Cb10 corresponds to a first capacitor.

As described above, in the DC/DC converter of the fourth embodiment of the present disclosure, like the DC/DC converter of the second embodiment of the present disclosure, when the switching transistor Q10 and the synchronous rectification transistor Q20 are turned off, the connection of the switch SWb10 in the series regulator SR10 is switched from the contact point b to the contact point c. Thus, when the switching transistor Q10 and the synchronous rectification transistor Q20 are turned off, i.e., in a so-called dead time period, since there is no change in voltage across the capacitor Cb10, the charging current Ib10 does not flow into the capacitor Cb10. This results in a decrease in power consumption of the DC/DC converter.

The DC/DC converters of the first to fourth embodiments of the present disclosure may be applied to a step-up/down DC/DC converter implementing both types of step-up and step-down.

(Correspondence Relation Between Elements of the Claims and the First to Fourth Embodiments)

In the first and second embodiments, the switching transistor Q1 corresponds to a first transistor and the synchronous rectification transistor Q2 corresponds to a second transistor. The source S of the switching transistor Q1 and the drain D of the synchronous rectification transistor Q2 correspond to main electrodes. The node N1 corresponds to a common node. The capacitor Cb corresponds to a first capacitor. The diode Db corresponds to a diode element. The capacitor C corresponds to a second capacitor. In the first embodiment, the switch SW corresponds to a switch and a charging stop circuit. In the second embodiment, the switch SWb corresponds to a switch and a charging stop circuit.

In the third and fourth embodiments, the switching transistor Q10 corresponds to a second transistor and the synchronous rectification transistor Q20 corresponds to a first transistor. The drain D of the switching transistor Q10 and the source S of the synchronous rectification transistor Q20 correspond to main electrodes. The node N10 corresponds to a common node. The capacitor Cb10 corresponds to a first capacitor. The diode Db10 corresponds to a diode element. The capacitor C10 corresponds to a second capacitor. In the third embodiment, the switch SW10 corresponds to a switch and a charging stop circuit. In the fourth embodiment, the switch SWb10 corresponds to a switch and a charging stop circuit.

INDUSTRIAL APPLICABILITY

The present disclosure can be used for electronic equipment, OA equipment, and the like and thus has high industrial applicability.

According to some embodiments of the present disclosure, it is possible to provide a synchronous rectification DC/DC converter including a bootstrap circuit, which is capable of reducing power consumption by stopping the operation of the bootstrap circuit in a period of dead time.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A synchronous rectification DC/DC converter comprising:
    a first transistor and a second transistor, each of the first transistor and the second transistor including a main electrode connected to a common connection point, the first transistor and the second transistor being NMOS transistors;
    a control circuit configured to control switching of the first transistor and the second transistor in a complementary manner;
    a bootstrap circuit that includes a first capacitor charged with a current supplied from a high voltage potential terminal and is configured to raise a voltage potential of a control electrode of the first transistor to turn on the first transistor;
    a charging stop circuit configured to stop the first capacitor from being charged from the high voltage potential terminal in a first time period in which the first transistor and the second transistor are turned off simultaneously; and
    a series regulator connected between the high voltage potential terminal and the bootstrap circuit and configured to lower a voltage potential of the high voltage potential terminal by a predetermined voltage and supply the lowered voltage potential to the bootstrap circuit,
    wherein a first end of the first capacitor is connected to the common connection point of the first transistor and the second transistor, the current is supplied from the high voltage potential terminal to a second end of the first capacitor, and the voltage potential of the control electrode of the first transistor is raised based on a voltage potential of the second end of the first capacitor, and
    wherein the charging stop circuit cuts off supply of a current from the high voltage potential terminal to the second end of the first capacitor by lowering the voltage potential of the second end of the first capacitor,
    wherein the charging stop circuit lowers the voltage potential of the second end of the first capacitor by decreasing a reference voltage of the series regulator, and
    wherein the charging stop circuit includes a switch which connects a negative electrode of a reference voltage source of the series regulator to the common connection point in the first time period in which the first transistor and the second transistor are turned off simultaneously, and connects the negative electrode of the reference voltage source of the series regulator to a low voltage potential terminal in a second time period in which the first transistor or the second transistor is turned on.

2. The synchronous rectification DC/DC converter of claim 1, wherein the switch includes a transistor.

3. The synchronous rectification DC/DC converter of claim 2, wherein the series regulator includes a third transistor and an error amplifier,
wherein a first electrode of the third transistor is connected to the high voltage potential terminal, and a second electrode of the third transistor is connected to the bootstrap circuit and a non-inverting input terminal of the error amplifier, and
wherein an output terminal of the error amplifier is connected to a control electrode of the third transistor, and an inverting input terminal of the error amplifier is connected to a positive electrode of the reference voltage source.

4. The synchronous rectification DC/DC converter of claim 1, wherein the series regulator includes a third transistor and an error amplifier,
wherein a first electrode of the third transistor is connected to the high voltage potential terminal, and a second electrode of the third transistor is connected to the bootstrap circuit and a non-inverting input terminal of the error amplifier, and
wherein an output terminal of the error amplifier is connected to a control electrode of the third transistor, and an inverting input terminal of the error amplifier is connected to a positive electrode of the reference voltage source.

5. The synchronous rectification DC/DC converter of claim 1, wherein, in the first time period in which the first transistor and the second transistor are turned off simultaneously, the voltage potential of the second end of the first capacitor is lowered by a forward voltage of a parasitic diode formed in the second transistor than the voltage potential of the second end of the first capacitor in the second time period in which the first transistor or the second transistor is turned on.

6. The synchronous rectification DC/DC converter of claim 1, wherein the first transistor is a switching transistor and the second transistor is a synchronous rectification transistor, and
wherein the DC/DC converter further comprises:
a smoothing circuit connected to the common connection point of the switching transistor and the synchronous rectification transistor; and
an output terminal outputting a voltage smoothed by the smoothing circuit.

7. The synchronous rectification DC/DC converter of claim 6, wherein the smoothing circuit includes:
an inductor connected between the output terminal and the common connection point of the switching transistor and the synchronous rectification transistor; and
a second capacitor charged with a current flowing into the inductor.

8. The synchronous rectification DC/DC converter of claim 1, wherein the first transistor is a synchronous rectification transistor and the second transistor is a switching transistor,
wherein the first transistor is connected between the common connection point and an output terminal, and
wherein the DC/DC converter further comprises:
an inductor connected between the high voltage potential terminal and the common connection point of the switching transistor and the synchronous rectification transistor; and
a second capacitor charged with a current flowing into the inductor.

* * * * *